US010733523B2

(12) United States Patent
Mueller et al.

(10) Patent No.: US 10,733,523 B2
(45) Date of Patent: Aug. 4, 2020

(54) QUANTUM COMPUTER HARDWARE WITH REFLECTIONLESS FILTERS FOR THERMALIZING RADIO FREQUENCY SIGNALS

(71) Applicant: International Business Machines Corporation, Armonk, NY (US)

(72) Inventors: Peter Mueller, Zurich (CH); Thomas Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/686,761

(22) Filed: Nov. 18, 2019

(65) Prior Publication Data

US 2020/0175412 A1 Jun. 4, 2020

Related U.S. Application Data

(63) Continuation of application No. 16/357,846, filed on Mar. 19, 2019.

(60) Provisional application No. 62/774,337, filed on Dec. 3, 2018.

(51) Int. Cl.
| | |
|---|---|
| *G06N 10/00* | (2019.01) |
| *H03H 11/54* | (2006.01) |
| *H03H 11/04* | (2006.01) |
| *H03K 17/92* | (2006.01) |
| *H03F 19/00* | (2006.01) |

(52) U.S. Cl.
CPC ............ *G06N 10/00* (2019.01); *H03H 11/04* (2013.01); *H03H 11/54* (2013.01); *H03K 17/92* (2013.01); *H03F 19/00* (2013.01); *H03F 2200/171* (2013.01)

(58) Field of Classification Search
None
See application file for complete search history.

(56) References Cited

U.S. PATENT DOCUMENTS

| 10,192,168 B2 | 1/2019 | Rigetti et al. |
| 2016/0126606 A1 | 5/2016 | Morgan |
| 2016/0377230 A1 | 12/2016 | Chuard et al. |
| 2018/0091115 A1 | 3/2018 | Abdo |

OTHER PUBLICATIONS

Krinner, S., et al., "Engineering cryogenic setups for 100-qubit scale superconducting circuit systems", arXiv:1806.07862v1, Jun. 20, 2018, 31 pages.

(Continued)

*Primary Examiner* — Jeffery S Zweizig
(74) *Attorney, Agent, or Firm* — Scully, Scott Murphy & Presser, P.C.; Daniel P. Morris

(57) ABSTRACT

A quantum computer hardware apparatus may include a first stage, which is connected to one or more signal generators, and a second stage adapted to be cooled down at a lower temperature than the first stage. Superconducting qubits are arranged in the second stage. The signal generators are configured, each, to generate radio frequency (RF) signals to drive the qubits, in operation. The apparatus may further include an intermediate stage between the first stage and the second stage, wherein the intermediate stage comprises one or more coolable filters, the latter configured for thermalizing RF signals from the signal generators. Related methods for thermalizing radio frequency signals in a quantum computer hardware apparatus are also disclosed.

20 Claims, 4 Drawing Sheets

(56) References Cited

OTHER PUBLICATIONS

Koch, J., et al., "Charge insensitive qubit design derived from the Cooper pair box", arXiv:cond-mat/0703002v2, Sep. 26, 2007, pp. 1-21.

Patra, B., et al., "Cryo-CMOS Circuits and Systems for Quantum Computing Applications", IEEE Journal of Solid-State Circuits, Jan. 2018, pp. 309-321, vol. 53, No. 1.

Corcoles, A.D., et al., "Demonstation of a quantum error detection code using a square lattice of four superconducting qubits", Nature Communications, Received Jan. 16, 2015, Accepted Mar. 18, 2015, Published Apr. 29, 2015, pp. 1-10.

Devoret, M.H., et al., "Superconducting Qubits: A Short Review", arXiv:cond-mat/0411174v1, Nov. 7, 2004, pp. 1-41.

Vandersypen, L., "Quantum Computing—The Next Challenge in Circuit and System Design", 2017 IEEE International Solid-State Circuits Conference (ISSCC 2017), Session 1, Feb. 6, 2017, pp. 24-29.

Morgan, M.A., et al., "Theoretical and Experimental Study of a New Class of Reflectionless Filter", IEEE Transactions on Microwave Theory and Techniques, May 2011, pp. 1214-1221, vol. 59, No. 5.

Morgan, M.A., et al., "Reflectionless Filter Structures", IEEE Transactions on Microwave Theory and Techniques, Apr. 2015, pp. 1263-1271, vol. 63, No. 4.

Mini-Circuits, "Reflectionless Filters Improve Linearity and Dynamic Range", Microwave Journal, www.microwavejournal.com/articles/24825-reflectionless-filters-improve-linearity-and-dynamic-range, Aug. 13, 2015, Accessed on Mar. 19, 2019, 7 pages.

Geerlings, K.L., "Improving Coherence of Superconducting Qubits and Resonators", A Dissertation Presented to the Faculty of the Graduate School of Yale University in Candidacy for the Degree of Doctor of Philosophy, Aug. 19, 2013, http://qulab.eng.yale.edu/documents/theses/Kurtis_ImprovingCoherenceSuperconductingQubits.pdf, Accessed on Mar. 19, 2019, 256 pages.

Emerson & Cuming Microwave Products, "ECCOSOB MF—Lossy, Magnetically Loaded, Machinable Stock", http://www.eccosorb.com/Collateral/Documents/English-US/MF.pdf, Revised Oct. 8, 2008, Accessed on Mar. 19, 2019, 5 pages.

QUANTUM COMPUTER HARDWARE WITH REFLECTIONLESS FILTERS FOR THERMALIZING RADIO FREQUENCY SIGNALS

BACKGROUND

The present disclosure relates in general to the field of quantum processing hardware apparatuses comprising superconducting qubit driven by radio frequency signals and, in particular, to techniques for thermalizing radio frequency signals in such apparatuses.

Recent advances in quantum computing are making such a technology ever more relevant to industrial applications. Quantum computing makes direct use of quantum-mechanical phenomena, such as superposition and entanglement to perform operations on entangled quantum bits (qubits), i.e., information stored in quantum states. Superconducting circuits are relatively easy to manufacture with current technologies and are thus candidates to further scale quantum information technologies. Today, it can be envisioned that in the near term a small quantum computer, based on a couple of hundreds of superconducting qubits with error mitigation or limited error correction, will be able to simulate quantum systems intractable to conventional computers.

Quantum computing devices are known, which are based on superconducting qubits of the transmon type. Such qubits are controlled by radio frequency (RF) technology. Such qubits need be operated at a temperature of a few mK only. RF signals are fed into the cryostat with coax cables using attenuators placed on intermediate temperature platforms to thermalize the signals for each of the upward and downward path. The attenuators are cooled to the temperatures of their respective platforms. In total, approximately 60 to 90 dB of attenuation is typically ensured between the signal generator and the qubits, thanks to such attenuators.

SUMMARY

According to a first aspect, the present invention is embodied as a quantum computer hardware apparatus. The apparatus includes a first stage, which is connected to one or more signal generators, as well as a second stage adapted to be cooled down at a lower temperature than the first stage. Superconducting qubits are arranged in the second stage. The signal generators are configured, each, to generate radio frequency (RF) signals to drive the qubits, in operation. The apparatus further includes an intermediate stage between the first stage and the second stage, wherein the intermediate stage comprises one or more coolable filters, the latter configured for thermalizing RF signals from the signal generators.

According to another but related aspect, the invention is embodied as a method for thermalizing radio frequency signals in a quantum computer hardware apparatus. Consistently with the above apparatus, the method involves generating RF signals conveyed through a first stage of the apparatus to drive superconducting qubits arranged in a second stage of this apparatus, where the second stage is cooled down at a lower temperature than the first stage. RF signals generated by the signal generators are thermalized at an intermediate stage between the first stage and the second stage, via one or more cooled filters arranged in this intermediate stage.

A concept underlying an embodiment of this invention relies on cooled filters (instead of attenuators) for thermalizing RF signals from the signal generators and thereby reduce both the signal energy dissipated in the second stage and power needed by the signal generators to generate the RF signals.

Apparatuses and methods embodying the present invention will now be described, by way of non-limiting examples, and in reference to the accompanying drawings.

BRIEF DESCRIPTION OF THE DRAWINGS

The accompanying figures, which together with the detailed description below are incorporated in and form part of the present specification, serve to further illustrate various embodiments and to explain various principles and advantages all in accordance with the present disclosure, in which:

FIG. 1A shows a high-level, schematic representation, while FIG. 1B addresses a more detailed solution (FIG. 1B is not prior art); FIG. 2A shows a high-level, schematic representation, while FIG. 2B is a more detailed depiction; FIG. 3A generally illustrates transmission characteristics of a dynamically adjustable bandpass filter, while FIG. 3B shows filter characteristics, wherein one frequency range of the signal is more attenuated than the neighboring frequency range.

The accompanying drawings show simplified representations of devices or parts thereof, as involved in embodiments.

DETAILED DESCRIPTION

Figure 1A:
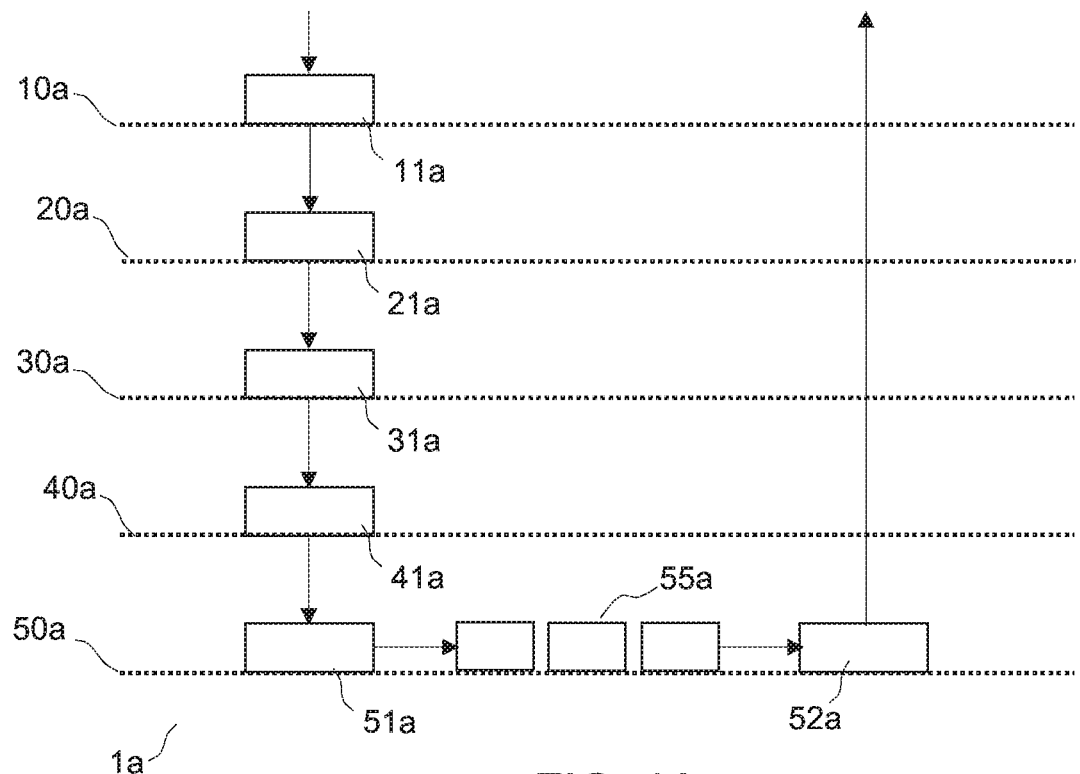
FIGS. 1A and 1B are block diagrams schematically illustrating selected components of a quantum computer hardware apparatus relying on signal attenuators to thermalize radio frequency signals in this apparatus.
Figure 1B:
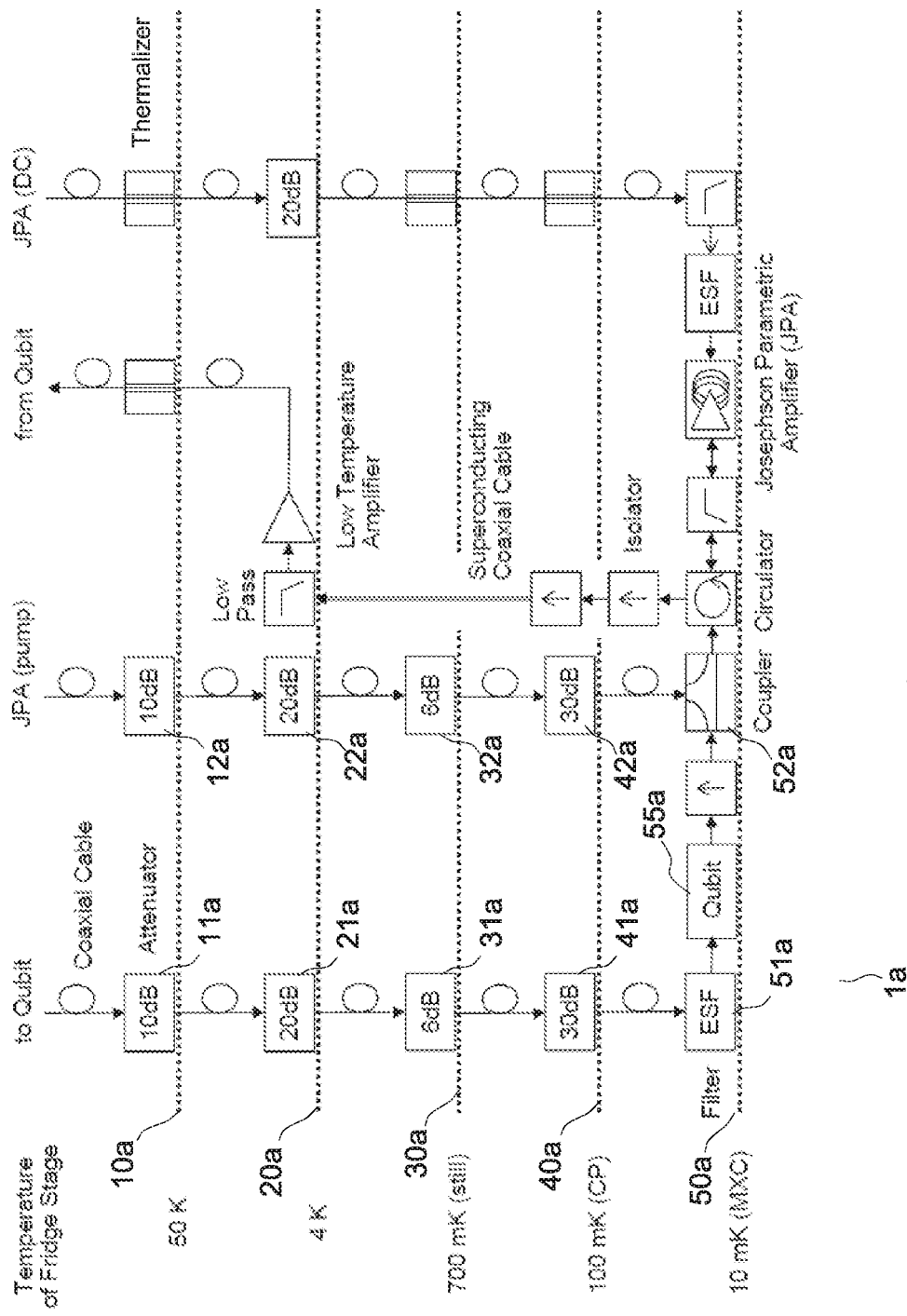

Attenuators $11a$-$41a$, $12a$-$42a$ are used in quantum information processing apparatuses $1a$ with several successive platforms (stages) $10a$-$50a$, as in FIGS. 1A, 1B. Once cooled to the platform temperature, such attenuators, allow radio frequency (RF) signals (as conveyed along lines denoted arrows in FIGS. 1A-2B) to be thermalized. Now, while such a solution reduces the noise, it also substantially reduces the intensity of the useful signal. This can become problematic where a large number of qubits $55a$ are contemplated, especially when a substantial part of the control electronics is placed in the vicinity of the qubit platform, e.g., on a 3-4 K platform. I.e., for a large number of qubits, the power in the attenuator adds up and if the signal is generated close to the 3-4 K platform, then one would prefer to generate low intensity signals due to the power needed to generate them.

There, it would be advantageous to reduce the number of electrical connections to the platform at room temperature and improve the delay and real-time behavior of the qubits $55a$ (especially on the feedback path). Now, an attenuation of 40 to 50 dB is typically needed between an intermediate platform $20a$-$40a$ (e.g., the 3-4 K platform) and the qubit platform $50a$, for thermalization purposes. This, however, has adverse consequences on the drive signals as higher signal levels are needed. Therefore, the present inventors have designed alternative solutions to thermalize RF signals, as now discussed detail.

Figure 2A:
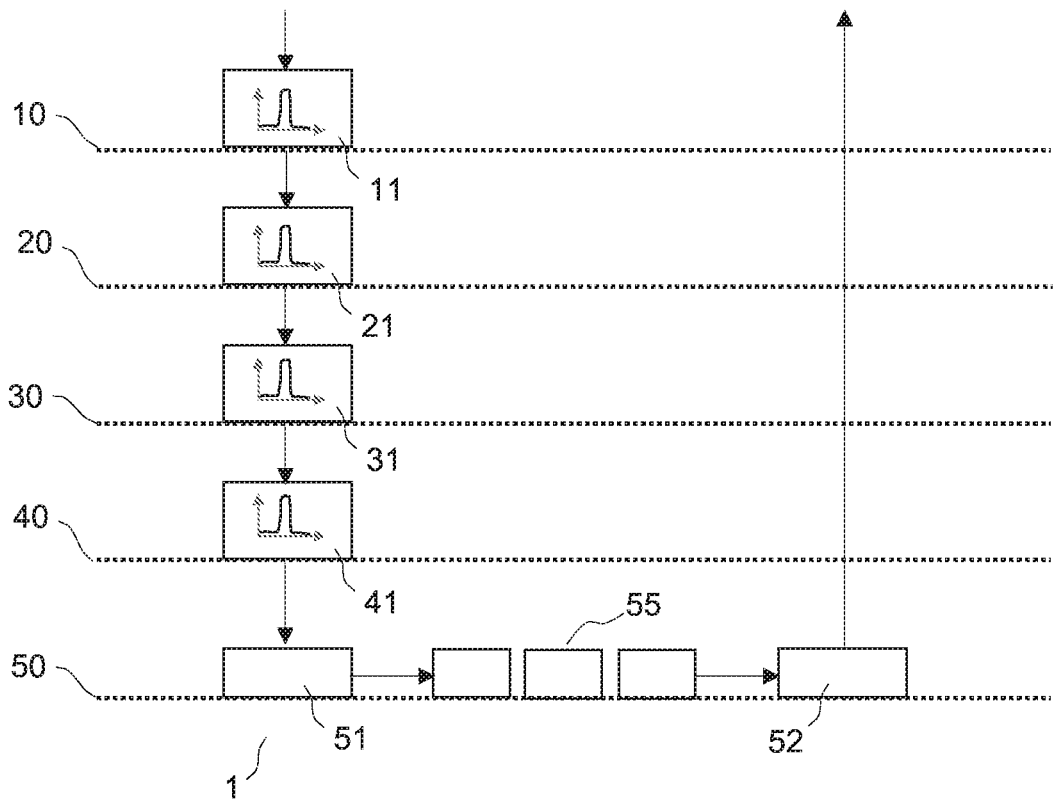
FIGS. 2A and 2B show other block diagrams schematically illustrating selected components of an apparatus including coolable filters for thermalizing radio frequency signals from the signal generators, as involved in embodiments.
Figure 2B:
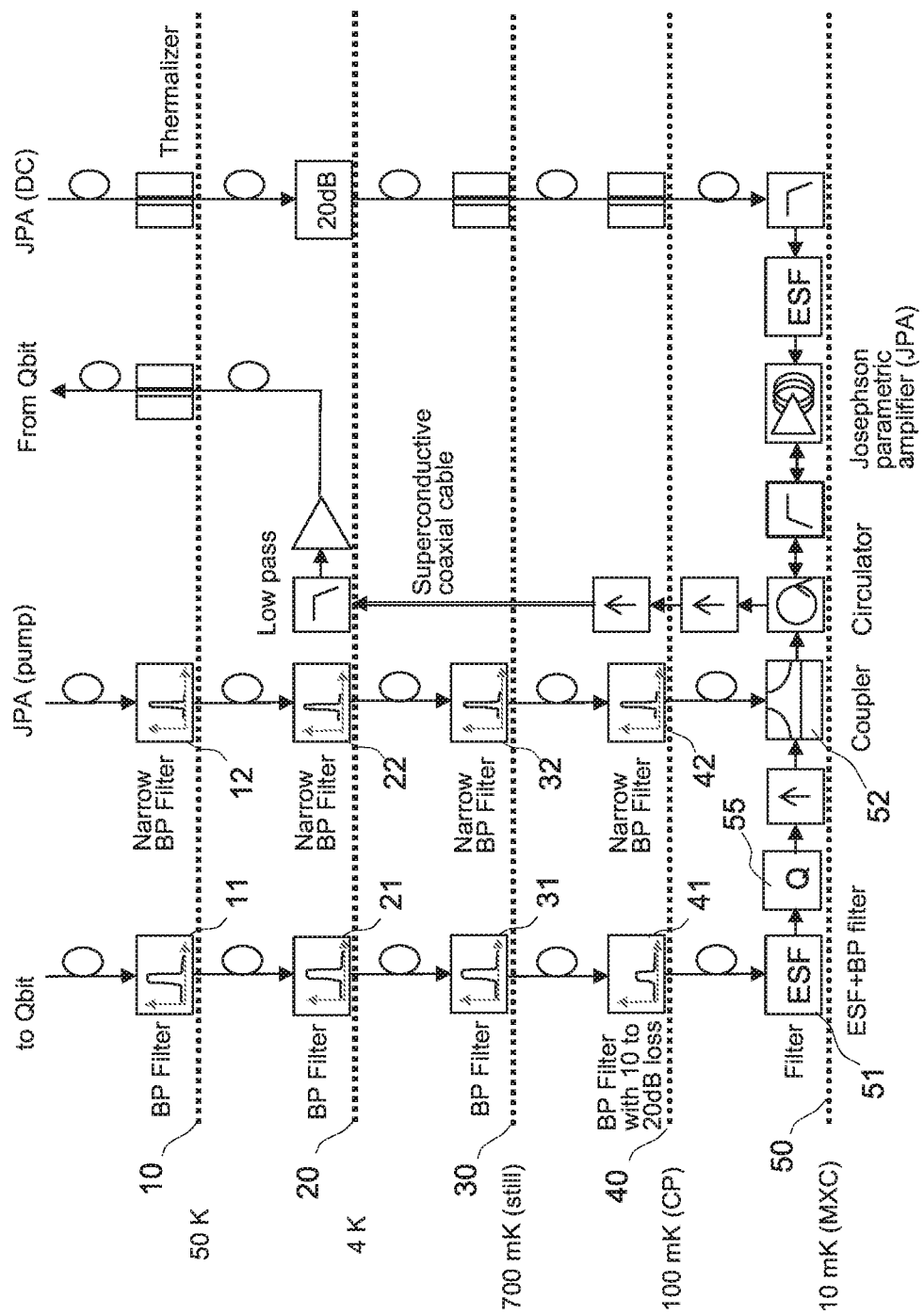
Figure 3A:
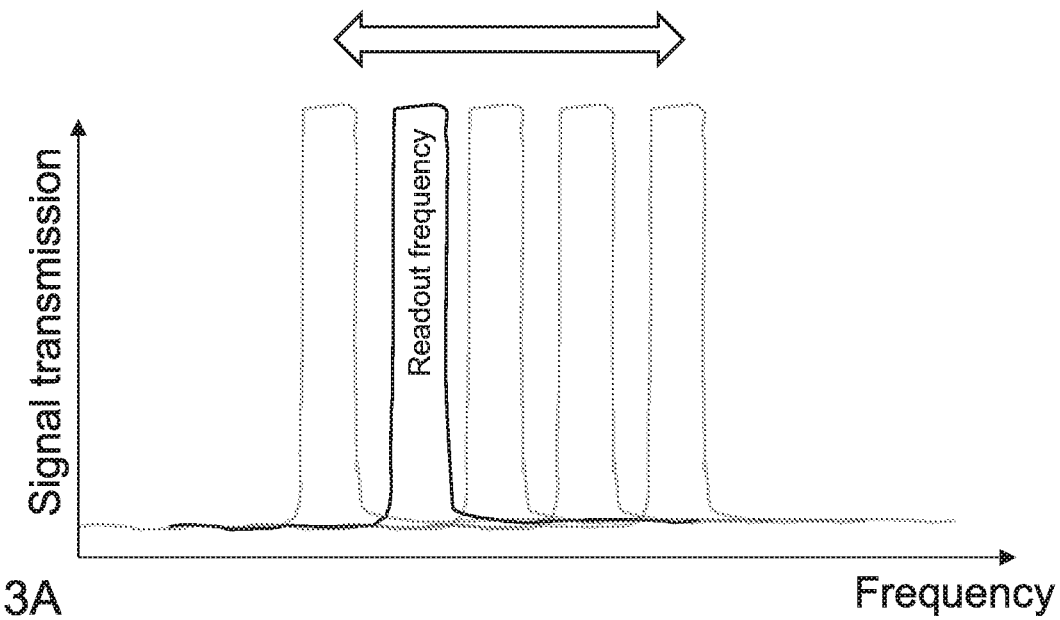
FIGS. 3A and 3B show curves illustrating how selective filters with dynamically adjustable frequencies can be used to adjust the allowed frequencies for multiplexed applications, as in embodiments.
Figure 3B:
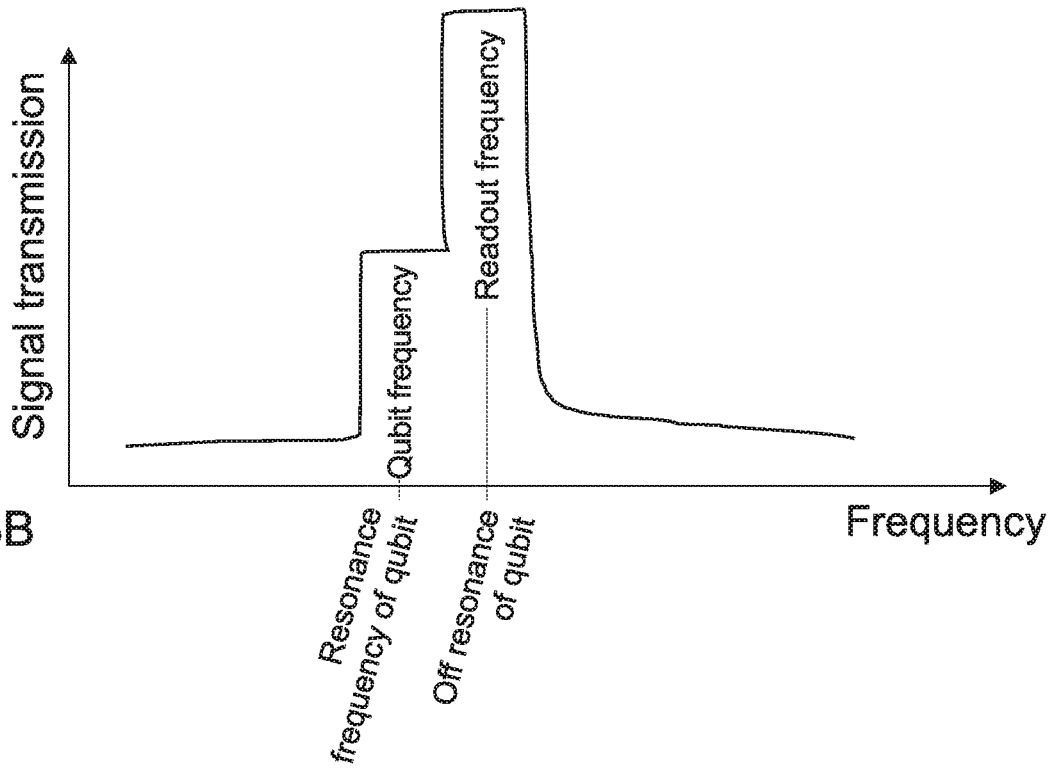

In reference to FIGS. 2A and 2B, an aspect of the invention is first described, which concerns a quantum computer hardware apparatus 1.

As usual, this apparatus includes a first stage, which is connected to one or more signal generators (not shown). The apparatus further includes a second stage 50, which is adapted to be cooled down at a lower temperature than the first stage.

Superconducting qubits 55 are arranged in the second stage 50. Note, numeral reference 55 may refer to several components and several types of such components, in embodiments as described below. The signal generators are configured, each, to generate RF signals to drive the qubits 55, in operation. While any RF signal may a priori be used (i.e., signals within $3 \; 10^5$ to $3 \; 10^{11}$ Hz) such signals can be microwave signals (i.e., signals whose frequencies are between $3 \; 10^8$ and $3 \; 10^{11}$ Hz) and also can be in the frequency range extending from 4 to 8 GHz.

Such superconducting qubits can be of the transmon type. The apparatus 1 may further comprise additional RF-controlled components, such as (tunable) couplers (e.g., frequency-tunable coupling elements). That is, qubits 55 may possibly be connected to one or more tunable couplers (i.e., couplers that contain non-linear elements for its frequency to be tunable), e.g., to allow transitions between states of the qubits to be parametrically driven, by modulating the tunable coupler energy. For example, two-qubit gates are known, which are implemented with transmon (fixed-frequency) qubits, where the qubits are coupled via such a frequency-tunable coupler. The latter is typically not meant to be used as a computational qubit. However, a tunable coupler can practically be embodied as a superconducting qubit. In variants, fixed-frequency couplers may be used.

Such couplers are assumed to form part of the block 55 in FIGS. 2A, 2B. In each of FIGS. 2A and 2B, the elements in the block 55 may likely include multiple qubits and couplers between them, as well other elements. As said, the couplers may have a fixed frequency or may contain non-linear elements to make them tunable. One method is to use Josephson junctions as non-linear elements and to tune them using an external magnetic field. In variants, a capacitive coupling may be relied upon. Other couplers may be used for different purposes. For example, in the embodiment depicted in FIG. 2B, a DC drive is involved on the RHS, downward path to the for the Josephson parametric amplifier (JPA), e.g., a low noise JPA, which typically involves a tunable adjustment scheme for its center frequency, used to adjust and optimize the amplifier on the qubit frequencies.

As illustrated in FIG. 2A and FIG. 2B, the apparatus 1 additionally includes one or more intermediate stages 10-40, each arranged between the first stage and the second stage 50. Note, the stage referred to as the "first stage" above is an upstream stage, which is not necessarily at room temperature (RT). Rather, this "first stage" may already be a cooled stage, such as the 4 K platform 20 in FIG. 2A, 2B. The second stage 50 is the coldest stage. The successive stages 10-50 (from the top stage 10 all the way down to the second stage 50) form a cryogenic signal line. Additional stages (not shown) may possibly be involved "above" stage 10.

Here, each intermediate stage 10-40 comprises one or more coolable filters 11-41, also referred to as cooled filters (once cooled, in operation of the apparatus 1) or as cold filters. In the present context, such filters are configured for thermalizing RF signals as obtained from the signal generators. Moreover, additional coolable filters 11, 51 will likely be arranged in the first and/or the second stage 50 as well. For example, the second stage 50 may advantageously include an Eccosorb filter (trade name), labeled as "ESF" filter 51 in FIG. 2B. Similarly, the very first stage (e.g., stage 10) may include a coolable filter 11. I.e., each of the stages involved may include one or more coolable filters.

Such filters 11-51 should be distinguished from mere attenuators. A concept underlying an embodiment of this invention is to rely on cooled filters instead of attenuators for thermalizing RF signals from the signal generators. As it may be realized, this makes it possible to optimize and reduce both a signal energy dissipated in the apparatus 1 and the power needed by the signal generators to generate the RF signals. This further allows the noise bands to be blocked down to levels determined by the thermal energy of the respective stages. Indeed, thanks to filters 11-51 as used herein, a smaller intensity signal is needed and therefore less power is dissipated and thus less power is needed in the generator. On the contrary, prior art solutions typically rely on attenuators 11a-51a, 12a-52a, as assumed in FIG. 1. Note, however, that the specific arrangement of platforms and electronics shown in FIG. 1B is not necessarily prior art.

In more detail, less driving signal amplitude is needed as thermalization is at least partially achieved by using filters instead of attenuators. This translates in less dissipated signal power in the cryostat, it being reminded that with a large number of qubits and signal lines, the dissipated power adds up.

The present solution is particularly interesting if the signal is initially generated on a cooled platform, which is, e.g., at a temperature between 2 and 6 K, and more likely between 3 and 5 K, this depending on the thermal load and other factors that locally impact the temperature. With respect to power dissipation, especially below 3 K where cooling gets inefficient, there is no need to generate a large signal amplitude in the present case thanks to the proposed filter configuration. As less signal gets dissipated though the filters 11-51, less power is needed in the first place, which also simplifies the generation of high-fidelity signals. Moreover, the present solution makes it possible to reduce the required signal level in such a way that it becomes compatible with standard low power CMOS, even at room temperature. I.e., said intermediate stage may possibly comprise CMOS-fabricated components, the latter including said one or more coolable filters.

Thus, by reducing power dissipation, embodiments of the invention eliminate the need for RF amplifiers, enable implementations in CMOS, and thereby opens the door to integration of large systems.

All this is now described in detail, in reference to particular embodiments of the invention. To start with, and as illustrated in FIGS. 2A, 2B, the apparatus 1 in one embodiment comprises several intermediate stages 10-40 arranged between the first stage and the second stage 50. Thus, the first stage, the intermediate stages 10-40, and the second stage 50 form a series (i.e., a chain) of successive stages, wherein each intermediate stage is adapted to be cooled down at a lower temperature than any previous stage (on top therefrom in FIGS. 2A, 2B) of the series. As further seen in FIGS. 2A, 2B, each intermediate stage comprises one or more coolable filters 11-41, 12-42, wherein each of the filters is configured for thermalizing RF signals throughout the intermediate stages.

As evoked earlier, the stage considered as the "first stage" is not necessarily at RT (and thus is not necessarily the topmost stage in the hierarchy instituted by FIGS. 2A, 2B).

Plus, any of the platforms 10-30 shown in FIGS. 2A, 2B may here be considered as the "first stage", inasmuch as there is at least one intermediate platform in between. Thus, the first stage may by an intermediate stage 10-30 of the hierarchy shown in FIGS. 2A, 2B, which stage may be adapted to be cooled at an already low temperature, e.g., between 2 and 6 Kelvin, in operation of the apparatus. The first stage may for example be cooled down to 4 K, as assumed for the platform 20 in FIGS. 2A, 2B. The present solution is especially interesting where RF signals are generated on such a platform, since there are still approximately 40 dB of thermalization needed between this platform and the qubit's.

The coolable filters 11-51, 12-52 are in one embodiment designed as reflectionless filters, which absorb signal in their stopband, instead of rejecting signals by reflecting them back outside of the passband. This way, the rejected signals do not combine. As the skilled person may appreciate, a cold reflectionless filter may be designed so as to only emit a noise signal level according to its temperature (imposed by the respective cooling stage), while attenuating and dissipating only a small amount of the useful signal desired. On the contrary, a classical LC filter transmits (substantially) all the signals inside its passband but reflects (substantially) all the signals in the stopband(s). As a result, the filter is matched (i.e., has a small S11 parameter) in the passband but has a high S11 parameter in the stopband. On the contrary, a reflectionless filter provides a match to all frequencies. I.e., the signal is fed through inside the passband, while being absorbed in the stopband. That is, all the signals are allowed in the passband, while all the signals are absorbed in the stopband (i.e., a lot more than it is reflected). Advantageously here, the absorption in the stopband is not an issue in terms of power consumption, since the signal absorbed will merely be noise in the present context. In addition, a reflectionless filter makes a clean thermal emitter in the stopband, which is desirable in applications as contemplated herein. Reflectionless filters prevent multiple reflections to combine, as noted above.

Advantages of reflectionless filters in terms of power consumption open the door to CMOS implementations. On the contrary, using attenuators for thermalization purpose typically require between 10 and 13 dBm of input signal power (corresponding to −1 V rms in a 50 Ohm system), which is very difficult to achieve with CMOS components, even at 300 K, due to the low maximum supply voltage allowed by this technology (which corresponds to −0.7 V to 1 V in practice, depending on the actual implementation).

For example, in embodiments, each of above coolable filters (or at least some of them) is configured as a reflectionless bandpass filter, thus allowing a signal inside its passband, while absorbing signal (noise) in its stopband, instead of reflecting it. Note, such bandpass filters can be designed for multiple signals having different attenuations.

Each of above coolable filters (or at least some of them) may possibly be configured so as to have dynamically adjustable bandpass characteristics. E.g., the passband frequency of such filters may be controlled by means of control devices such as switches, transistors or varactors, for example. Thus, such filters can be configured as selective filters, whose bandpass is adjusted to the qubit frequency and/or the readout frequency. Multiple readout frequencies of multiplexed qubits can accordingly be conveyed over a single line (as assumed in FIG. 2B). Similarly, multiplexed qubit drives can be achieved, if necessary.

As said, the apparatus 1 may possibly include additional RF-controlled components, such as couplers (e.g., frequency-tunable couplers, as part of block 55). Thus, cooled filters may be used for thermalizing the qubit control signals and/or coupler signals. That is, one may want to use filters on the path to the coupler(s) connected between the qubits, as in embodiments. Thus, additional coolable filters 12-42 can be arranged in the intermediate stages, as illustrated in FIGS. 2A and 2B. E.g., a first set of coolable filters 11-51 may be arranged on the downward path to the qubits, while a second set of coolable filters 12-42 may be arranged on the path to the directional coupler 52. Each filter of the second set is configured for thermalizing RF signals transmitted to this coupler 52. More generally, cooled filters may be used for thermalizing the qubit control signals, the coupler signals, and/or the readout signals (not shown).

As further illustrated in FIGS. 2A, 2B, each filter of the second set may be configured as a narrowband reflectionless bandpass filter. Even though the need for filters on the path to the couplers or on the return path is less stringent than on the path to the qubits, such filters can be implemented as reflectionless filters, to mitigate adverse backaction to the qubits, which would else potentially lead to decoherence.

In fact, cold filters 11-51, 12-42 may possibly replace all attenuators meant to thermalize the RF signals, as assumed in FIG. 2A, 2B (compare FIGS. 1B and 2B). Thus, in embodiments, none of the intermediate stage comprises thermalizing attenuators (i.e., attenuators configured to attenuate a RF signal from the signal generators, the qubits, or the tunable couplers). Still, depending on the implementation chosen, RF signals may still need be slightly attenuated in the passband of the filters too, though less than in their stopbands, as such filters will likely attenuate the signal as possible in their stopbands and, this, down to the temperature of the cooling stage. Thus, in variants, attenuators may still be needed, in addition to the present filters.

According to another aspect, the present invention can be implemented as a method for thermalizing RF signals in a quantum computer hardware apparatus such as described above.

This method revolves around generating RF signals (at or upstream a first stage of the apparatus), in order to drive superconducting qubits arranged in a second stage, where the latter is cooled down at a lower temperature than the first stage. Meanwhile, the RF signals generated by the signal generators are thermalized via one or more cooled filters 11-41, at one or more intermediate stages 10-40 between the first stage and the second stage 50.

Moreover, a similar filter arrangement may be implemented on the path to the coupler 52 and/or on the return path (from the qubits), as discussed earlier. I.e., RF signals transmitted to the coupler 52 and/or returned from the qubits in one embodiment are thermalized via additional set(s) of cooled filters 12-42 arranged at the level of said intermediate stage(s).

The above embodiments have been succinctly described in reference to the accompanying drawings and may accommodate a number of variants. Several combinations of the above features may be contemplated. Examples are given below.

FIG. 2B shows a more detailed version of the system depicted in FIG. 2A. The downward signal path labeled "to Qbit" involves reflectionless bandpass filters 11, 21, 31, 41, 51 cooled to respective platform temperatures. Each of these bandpass filters ensures little attenuation for the desired control signal traveling from the generator(s) towards the qubits. On the other hand, the out-of-band noise is absorbed in the reflectionless bandpass filters 11-51. This way a thermalization of the signal is achieved with a controlled signal attenuation. For example, in a typical implementation, the filter 41 will approximately provide 10 to 20 dB of attenuation, to reduce the signal to the very small amplitude needed to excite the qubits. On the 20 mK platform the signal is passed through a further thermalizing bandpass filter including an Eccosorb filter (as part of the ESF component 51), whose role is to remove any residual, high-frequency radiation (typically in the infrared frequency range). The next block 55 (labeled "Q") denotes multiple device elements, which may include one or more qubits, couplers, read-out resonators, and other components, as noted earlier. The output side of block 55 is first connected to an isolator, i.e., a passive device which allows RF signal to propagate in only one direction. This isolator allows signal to propagate in the desired direction, while blocking noise coming from the other direction. The block 52 denotes a directional coupler, i.e., another passive microwave device combining the pump signal for the JPA and the qubit readout signal. The path labeled "JPA pump" provides the pump signal for the JPA, from, e.g., room temperature, down to the mK level. A series of reflectionless filters 12, 22, 32, 42 are again relied on, each thermally attached to a respective temperature platform. Their function is similar to that of the filters used in the first path, although here more narrowband filters can be used as the pump signal is at a defined frequency. Only this pump signal is needed to pass the filters. The pump signal and the qubit readout signal are leaving the coupler 52 and are fed into a circulator, i.e., a passive microwave device (here having three terminals). The signal can propagate in only one direction (the counter clockwise direction in FIG. 2B). Such a circulator is known per se, it relies on magnetism as used, e.g., in a radar to separate the RX and TX path connected to one antenna. In the present system at the first output of the circulator a high pass filter is connected and afterwards is a JPA. The amplified signal is reflected, passes again trough the circulator and exits at its third output. Through two isolators and a low pass filter the signal is fed into a traditional, electrical, low noise amplifier, which further amplifies the readout signal. The last path, labeled "JPA (DC)", supplies the necessary DC bias for the JPA, again trough some attenuator, feed through for thermalization. Typically, also in this path some ESF filter is used to keep any thermal noise out of the system.

Advantages achieved in embodiments of the present invention may include:

Less driving signal amplitude is needed if thermalization is at least partially achieved thanks to the cooled filters (e.g., selective filters) instead of attenuators;

Using cooled filters allow less dissipated signal power in the cryostat, it being reminded that dissipated power would critically add up with a large number of qubits and signal lines;

The present solutions are particularly advantageous if RF signals are generated on a 3-4 K platform; and The required signal level can be reduced to an extent such that standard CMOS hardware become capable to generate the required signal levels. In variants, a GaAs-based technology can be contemplated, amongst others.

Some embodiments may not have these potential advantages and these potential advantages are not necessarily required of all embodiments.

In some embodiment, instead of attempting to improve the qubits, present embodiments aim at improving the required drive power to a level where it can be supplied directly with standard technology (e.g., CMOS), without applying expensive RF amplification, which, in turn, opens the door to direct implementation in such standard technology and integration into large systems.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, in FIG. 2B, the "low pass" behind the 'superconductive coaxial cable and the "high pass" on the LHS of the JPA may involve a band pass filter, which may not necessarily be a thermalizing filter. Also, in the block 51 ("ESF+BP filter"), the BP filter may likely be a thermalizing filter.

What is claimed is:

1. A quantum computer hardware apparatus, comprising:
   a first stage connected to a signal generator;
   a second stage with superconducting qubits arranged therein, the second stage adapted to be cooled down at a lower temperature than the first stage, wherein the signal generator is configured to generate radio frequency signals to drive the qubits; and
   an intermediate stage between the first stage and the second stage, wherein the intermediate stage comprises at least a coolable filter, the coolable filter configured for thermalizing radio frequency signals from the signal generator,
   wherein said intermediate stage comprises CMOS-fabricated components, the CMOS-fabricated components including said coolable filter.

2. The quantum computer hardware apparatus according to claim 1, wherein
   the first stage is adapted to be cooled at a temperature between 2 and 6 Kelvin, in operation of the apparatus.

3. The quantum computer hardware apparatus according to claim 1, wherein
   the coolable filter is configured as a reflectionless bandpass filter, allowing a signal inside a passband thereof while absorbing signal in a stopband thereof.

4. The quantum computer hardware apparatus according to claim 3, wherein
   the coolable filter is configured so as to have dynamically adjustable bandpass characteristics.

5. The quantum computer hardware apparatus according to claim 1, wherein
   the coolable filter belongs to a first set of coolable filters,
   the second stage further includes at least one coupler connected to the superconducting qubits, and
   said intermediate stage further includes a second set of at least one coolable filter, each configured for thermalizing radio frequency signals transmitted to said at least one coupler.

6. The quantum computer hardware apparatus according to claim 5, wherein each of the at least one coolable filter of the second set is configured as a narrowband, reflectionless bandpass filter.

7. The quantum computer hardware apparatus according to claim 1, wherein
said intermediate stage does not include any attenuator configured to attenuate a radio frequency signal from said signal generator.

8. The quantum computer hardware apparatus according to claim 1, wherein
each of said superconducting qubits is of the transmon type.

9. The quantum computer hardware apparatus according to claim 1, wherein
the second stage further includes at least one frequency-tunable coupling element, each coupled to two or more of the qubits.

10. A method for thermalizing radio frequency signals in a quantum computer hardware apparatus, the method comprising:
generating radio frequency signals conveyed through a first stage of the apparatus to drive superconducting qubits arranged in a second stage, while cooling down the second stage at a lower temperature than the first stage; and
at an intermediate stage between the first stage and the second stage, thermalizing the radio frequency signals generated by signal generators via a cooled filter arranged in said intermediate stage, wherein
the cooled filter is configured as a reflectionless bandpass filter, said radio frequency signals being thermalized by allowing a signal inside a passband of said cooled filter while absorbing a signal in a stopband of said filter.

11. The method according to claim 10, wherein
the apparatus comprises several intermediate stages, the several intermediate stages including at least said intermediate stage, wherein the several intermediate stages are arranged between the first stage and the second stage, so as for the first stage, the intermediate stages, and the second stage to form a series of stages, and wherein each of the several intermediate stages comprises a cooled filter, and
the method comprises, while generating said radio frequency signals, cooling down each of the intermediate stages at a lower temperature than any previous stage in the series, and
thermalizing said radio frequency signals throughout the intermediate stages via the cooled filter thereof.

12. The method according to claim 10, wherein the method further comprises
cooling down the first stage at a temperature between 2 and 6 Kelvin, while cooling down the second stage at a lower temperature than the first stage.

13. The method according to claim 10, wherein the method further comprises
dynamically adjusting bandpass characteristics of the cooled filter arranged in the intermediate stage.

14. The method according to claim 10, wherein
said cooled filter belongs to a first set of cooled filters,
the second stage further includes at least one coupler connected to the superconducting qubits, and
said intermediate stage further includes a second set of at least one cooled filter, the method further including, at said intermediate stage, thermalizing radio frequency signals transmitted to said at least one coupler via the second set of at least one cooled filter.

15. The method according to claim 14, wherein
each of the at least one cooled filter of the second set is configured as a narrowband reflectionless bandpass filter.

16. A quantum computer hardware apparatus, comprising:
a first stage connected to a signal generator;
a second stage with superconducting qubits arranged therein, the second stage adapted to be cooled down at a lower temperature than the first stage, wherein the signal generator is configured to generate radio frequency signals to drive the qubits; and
an intermediate stage between the first stage and the second stage, wherein the intermediate stage comprises at least a coolable filter, the coolable filter configured for thermalizing radio frequency signals from the signal generator, wherein
the coolable filter belongs to a first set of coolable filters,
the second stage further includes at least one coupler connected to the superconducting qubits, and
said intermediate stage further includes a second set of at least one coolable filter, each configured for thermalizing radio frequency signals transmitted to said at least one coupler.

17. The quantum computer hardware apparatus of claim 16, wherein
each of the at least one coolable filter of the second set is configured as a narrowband, reflectionless bandpass filter.

18. The quantum computer hardware apparatus of claim 16, wherein
said intermediate stage does not include any attenuator configured to attenuate a radio frequency signal from said signal generator.

19. The quantum computer hardware apparatus of claim 16, wherein
each of said superconducting qubits is of the transmon type.

20. The quantum computer hardware apparatus of claim 16, wherein
the second stage further includes at least one frequency-tunable coupling element, each coupled to two or more of the qubits.

* * * * *